United States Patent [19]

Masson et al.

[11] Patent Number: 4,799,179
[45] Date of Patent: Jan. 17, 1989

[54] SIGNAL ANALYSING AND SYNTHESIZING FILTER BANK SYSTEM

[75] Inventors: Jacques L. R. Masson, Chatou; Zdenek Picel, Velizy, both of France

[73] Assignee: Telecommunications Radioelectriques et telephoniques T.R.T., Paris, France

[21] Appl. No.: 822,503

[22] Filed: Jan. 27, 1986

[30] Foreign Application Priority Data

Feb. 1, 1985 [FR] France .................. 85 01429

[51] Int. Cl.$^4$ .............................................. G06F 7/38
[52] U.S. Cl. .................................................. 364/724.1
[58] Field of Search ........................................ 364/724

[56] References Cited

U.S. PATENT DOCUMENTS 4,131,764 12/1978 Classen et al. ............... 364/726 X
4,623,980 11/1986 Vary .................................. 364/724

FOREIGN PATENT DOCUMENTS 3510573 9/1986 Fed. Rep. of Germany ...... 364/724

OTHER PUBLICATIONS

Bellanger et al., "*TDM-FDM Transmultiplexer:Digital Polyphase and FFT*", IEEE Trans. on Communications, vol. Com-22, No. 9 Sep. 1974, pp. 1199-1205.
Rothweiler, "*Polyphase Quadrature Filter—A New Subband Coding Technique*" Proceedings, IEEE Inter. Conference on Acoustics, Speech and Signal Processing, vol. 3, Apr. 1983 (ICASSP 83), pp. 1280-1283.
Nussbaumer et al., "*Computationally Efficient QMF Filter Banks*" Proeedings, IEEE Inter. Conference on Acoustics, Speech and signal Processing, vol. 1, Mar. 1984 (ICASSP 84), pp. 11.3.1–11.3.4.
Nussbaumer, "*Pseudo QMF Filter Bank*", IBM Tech. Discl. Bull., vol. 24, No. 6 Nov. 1981, pp. 3081-3087.
Croisier et al., "*Perfect Channel Splitting by use of Interpolation/Decimation/Tree Decomposition Techniques*", Proceedings of the International Conference on Information Sciences and Systems, pp. 443-446 (Patras, Aug. 1976).

Primary Examiner—Gary V. Harkcom
Assistant Examiner—Tan V. Mai
Attorney, Agent, or Firm—Anne E. Barschall

[57] ABSTRACT

In a signal analysing and synthesizing filter bank system, the analysing bank receives a signal sampled at the rate $f_e$ and produces N contiguous subbank signals sampled at the rate $f_e/N$. From the subband signals the synthesizing bank must recover the incoming signal. These filter banks are formed by modulation of a prototype filter by sinusoidal signals which, for subband k ($0 \leq k \leq N=1$), have a frequency $(2k30\ 1)f_e/(4N)$ and respective phases $+(2k+1)\pi/4$ and $-(2k+1)\pi/4$ for the analysing and synthesizing banks. These signals are furthermore delayed by a time delay $(N_c-1)/2f_e)$, where $N_c$ is the number of coefficients of the prototype filter. Preferably, the analysing bank is realized by the cascade arrangement of an N-branch polyphase network (12) and a double-odd discrete cosine transform calculating arrangement (14) and the synthesizing bank is realized by the cascade arrangement of a double-odd discrete cosine transform calculating arrangement (15) and an N-branch polyphase network (17).

5 Claims, 6 Drawing Sheets

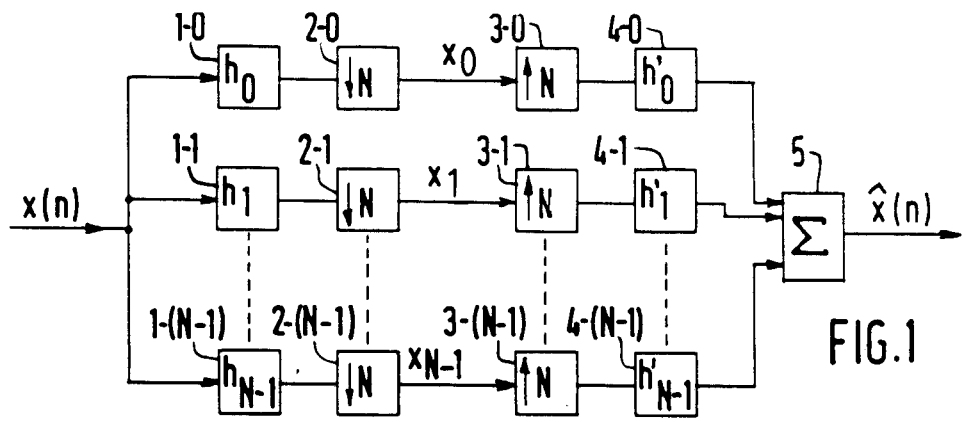
FIG.1
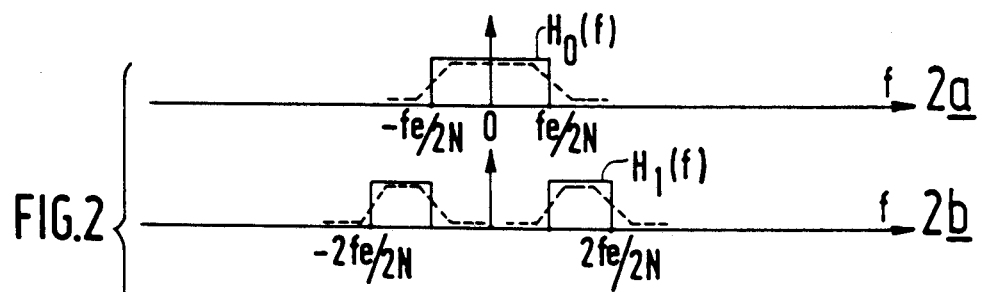
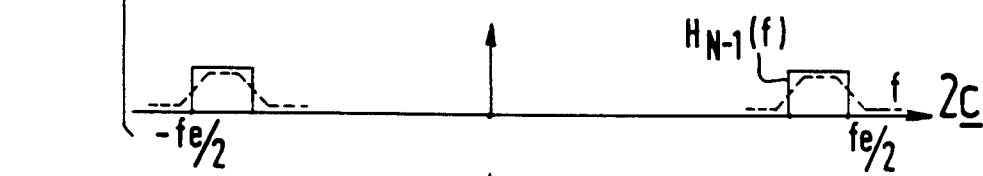
FIG.2
FIG.3

SIGNAL ANALYSING AND SYNTHESIZING FILTER BANK SYSTEM

BACKGROUND OF THE INVENTION

1. Field of the Invention

The invention relates to a digital signal processing system comprising an analysing filter bank for dividing an incoming signal sampled at a rate $f_e$ and occupying a frequency band limited to $f_e/2$, into N contiguous subband signals having a bandwidth of $f_e/2N$ and being sampled at the rate $f_e/N$, and a synthesizing filter bank for recovering said incoming signal from said subband signals, said filter banks being formed by modulating a prototype low-pass filter having a finite and symmetrical impulse response, having a beginning-of-attenuation-band frequency $f_a$ less than $f_e/2N$ and satisfying the condition $H^2(f)+H^2(f_e/2N-f)=1$ in the band of frequencies f extending from 0 to $f_a$, where H(f) is the absolute value of the frequency response, modulating the prototype filter being effected by N sinusoidal modulation signals which, for forming the k-th subband (k extending from 0 to N−1), are characterized by the frequency $f_k=(2k+1)f_e/(4N)$, by the phase $\alpha_k$ for the analysing bank and by the phase $-\alpha_k$ for the synthesizing bank, the phase $\alpha_k$ being such that for the subband of the order k=0 the phase $\alpha_o=\pi/4, 3\pi/4, 5\pi/4$ or $7\pi/4$ and such that for two contiguous subbands of the order k and k−1 the difference $\alpha_k-\alpha_{k-1}=\pi/2$ or $-\pi/2$.

2. Prior Art

Such systems comprising a cascade arrangement of an analysing bank and a synthesizing bank may be employed for, for example, reduced-rate encoding of a speech signal by quantizing the subband signals produced by the analysing bank with a number of variable levels depending on the energy of each subband signal.

In order to reduce the complexity of the filters in the considered filter banks, the filters are given comparatively wide transition bands which partly overlap for contiguous filters. The result of this is that the recovered signal coming from the synthesizing bank can be affected by spurious components due to the inevitable spectral folding (aliasing), which have an annoying level.

It is possible to avoid the influence of this spectral folding by an appropriate choice of the corresponding filter couples of the analysing and synthesizing banks.

This possibility has been demonstrated for filter banks having two subbands and has been extended to filter banks having a number of subbands equal to a power of two, thanks to the use of special half-band filters: for this subject see the article by A. Croisier, D. Esteban and C. Galand, "Perfect Channel Splitting by Use of Interpolation/Decimation, Tree Decomposition Techniques", published in the Proceedings of the International Conference on Information Sciences and Systems, pages 443-446, Patras, August, 1976. But, besides the fact that this procedure is limited as regards the possible number of subbands, it requires a comparatively large number of calculations and memories.

For effectively realizing filter banks, there is a technique originally developed in transmultiplexer systems and consisting in using for a filter bank a structure constituted by a polyphase network associated with a fast Fourier transform: for this subject reference is made to the article by M. G. Bellanger and J. L. Daguet, "TDM-FDM Transmultiplexer: Digital Polyphase and FFT", published in IEEE Trans. on Commun., Vol. COM-22, No. 9, September, 1974. It should be noted that, in this application, the subbands to be realized are disjunct and the spectral folding problem is avoided by means of filters having a narrow transition band which is situated between the subbands.

A technique of the type used in transmultiplexer systems but suitable for realizing the analysing and synthesizing filter banks of the system now under consideration, that is to say providing subbands which are not disjunct, has been studied for certain specific cases by J. H. Rothweiler in the article "Polyphase Quadrature Filters—A New Subband Cooling Technique" published in Proc. ICASSP 83, Boston, pages 1280-1283, and by H. H. Nussbaumer and M. Vetterli in the article "Computationally Efficient QMF Filter Banks" published in Proc. ICASSP 84, San Diego, pages 1131-1134. For these specific cases, the number of subbands generally is a power of two and the number of coefficients of each filter of the filter bank is a multiple of the number of subbands and, in an implementation utilizing a polyphase network and a Fourier transform, this implies the use of a same even number of coefficients in all the branches of the polyphase network.

SUMMARY OF THE INVENTION

The present invention has for its object to avoid all these limitations and to provide a couple of analysing and synthesizing filter banks requiring a minimum of calculations and memories, even when the number of subbands required is not a power of two and the number of coefficients required for each filter differs from a multiple of the number of subbands (that is to say the branches of the polyphase network have a variable number of coefficients).

According to the invention, the digital signal processing system, in which the incoming signal is sampled at the rate $f_e$ and which comprises an analysing filter bank and a synthesizing filter bank, each of which is formed by modulating a prototype filter by sinusoidal modulation signals having a frequency $f_k=(2k+1)f_e/(4N)$ and a phase $+\alpha_k$ and $-\alpha_k$ for the analysing bank and the synthesizing bank, respectively, and the phase $\alpha_k$ is such that for the subband of the order k=0 the phase $\alpha_o=\pi/4, 3\pi/4, 5\pi/4$ or $7\pi/4$ and such that for two contiguous subbands of the order k and k−1 the difference $\alpha_k-\alpha_{k-1}=+\pi/2$ or $-\pi/2$, is characterized in that said modulation signals are furthermore delayed by a time delay $\tau=(N_c-1)/(2f_e)$, where $N_c$ is the number of coefficients required to realize the characteristics of the prototype filter.

In an efficient implementation of the system according to the invention, the analysing bank is formed by:

a polyphase network having N branches over which, in each period NT with $T=1/f_e$, N samples of the signals entering the analysing bank are distributed, this polyphase network being arranged for calculating, at each period NT characterized by N and for each of its branches characterized by $\rho$ (varying from 0 to N−1), a signal $P_\rho(m)$ produced from the coefficients of the prototype filter and from $\lambda$ consecutive samples entering the branch, where $\lambda$ is the integral part of $(N-N_c+1)/N$, a double-odd discrete cosine transform calculation arrangement receiving the N signals $P_\rho(m)$ produced by the polyphase network and arranged for calculating the N subband signals $X_k(m)$ in accordance with the expression:

$$X_k(m) = \sum_{p=0}^{N-1} C_N(k,p) \cdot P_p(m)$$

where the coefficients $C_n(k,p)$ are such that $$C_N(k,p) = 2\cos\left[\frac{(2k+1)(2p+1)\pi}{4N}\right].$$

It is also advantageous to form the synthesizing filter bank in a similar way with the aid of a double-odd discrete cosine transform, calculation arrangement, which receives the subband signals and is coupled to a polyphase network whose output signals are time-distributed for forming the output signal of the synthesizing bank.

BRIEF DESCRIPTION OF THE DRAWING

Features of the invention will be more fully appreciated from the following description of an exemplary embodiment when considered in conjunction with the accompanying drawings, in which:

FIG. 1 shows a block diagram of the system according to the invention, in a parallel structure;

FIGS. 2a–2c show the absolute value of the frequency responses of the analysing and synthesizing filters of the orders $0, 1, \ldots, N-1$;

FIG. 3 shows in FIG. 3a the absolute value of the frequency response of the prototype filter and in FIGS. 3b, 3c and 3d the spectra of the signals for modulating the prototype filter, by means of which it is possible to obtain the analysing and synthesizing filters of the orders $0, 1, \ldots, N-1$;

DETAILED DESCRIPTION OF THE PREFERRED EMBODIMENT

Figure 4:
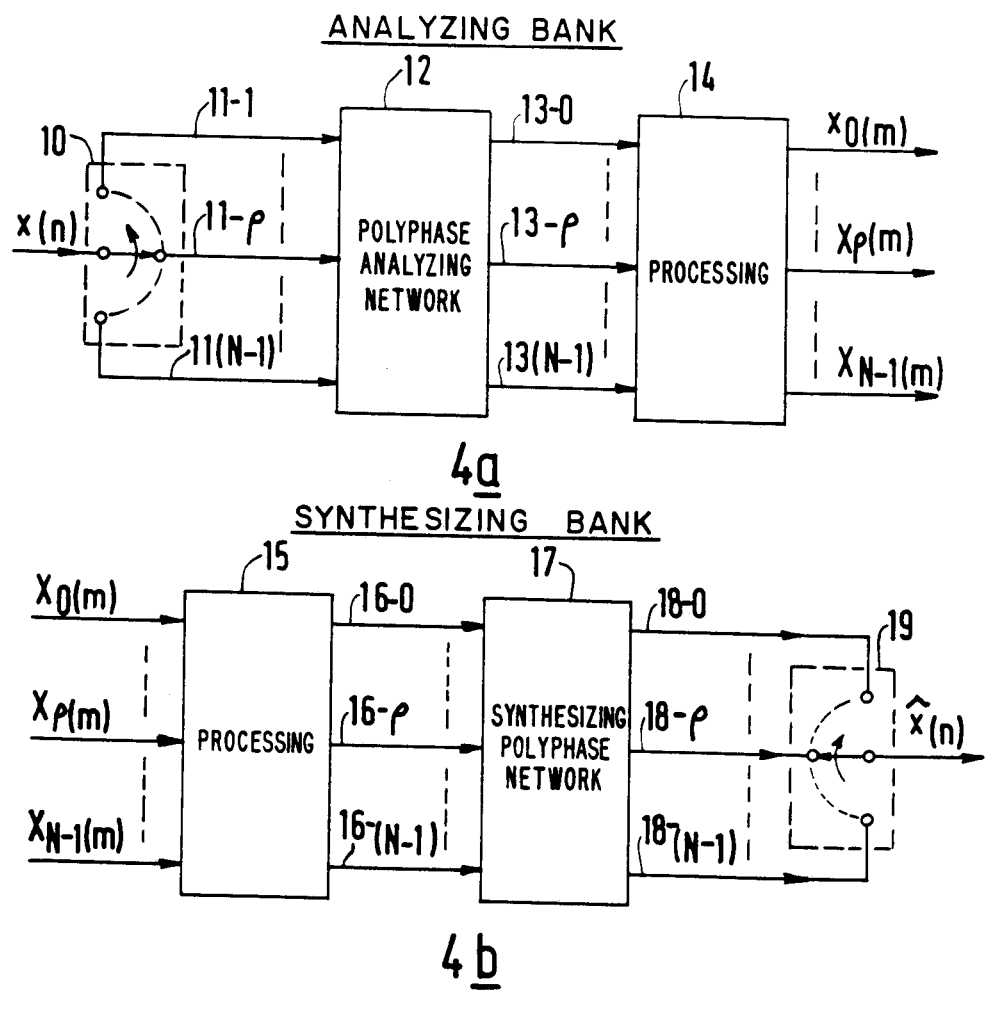
FIGS. 4a–4b show a block diagram of the system according to the invention, in a structure comprising a polyphase network and an arrangement for calculating the discrete cosine transform in order to realize each filter bank.

FIG. 1 shows, a parallel form of the processing system according to the invention intended for decomposing an incoming signal into contiguous subband signals and for recovering the incoming signal from the subband signals, with the object, for example, of reducing the bit rate of the signal by a suitable encoding of the subband signals.

The incoming signal $x(n)$ sampled at the sampling rate $f_e$ at instants $nT (T = 1/f_e)$ and occupying a frequency band limited to the frequency $f_e/2$, is applied to an analysing filter bank formed by a set of parallel filters 1-0 to 1-(N−1) having impulse responses $h_0$ to $h_{N-1}$. Filters 1.0 to 1-(N−1) are for dividing the frequency band (0, $f_e/2$) of the incoming signal into N contiguous subbands, each having a bandwidth of $f_e/2N$. The down-sampling arrangements 2-0 to 2-(N−1) take one sample out of N samples in the signals coming from the analysing filter bank and thus supply subband signals $x_0$ to $x_{N-1}$ sampled at the rate $f_e/N$. The down-sampling operation thus performed results in that all the signals coming from the filters are brought down to the baseband 0-$f_e/2N$. For the sake of convenience, processing operations effected on signals $x_0$ to $x_{N-1}$, such as an adaptative quantization, are not shown. According to FIG. 1 these signals are applied to up-sampling arrangements 3-0 to 3-(N−1) which bring the sampling rate back to the value $f_e$ by adding (N−1) zeroes between two consecutive samples of these signals. The up-sampling thus performed results in the spectra of the subband signals $x_0$ to $x_{N-1}$ being distributed over the frequency axis with a repetition rate $f_e/2$. The outgoing signals of up-sampling arrangements 3-0 to 3-(N−1) are applied to a synthesizing filter bank. The synthesizing filter bank is formed by a set of filters 4-0 to 4-(N−1) having respective impulse responses $h'_0$ to $h'_{N-1}$ so as to supply the same signals are those supplied by filters 1-0 to 1-(N−1) of the analysing bank. Finally, the outgoing signals of filters 4-0 to 4-(N−1) are applied to a summing arrangement 5 producing an output signal $\hat{x}(n)$ which must be as accurate a replica as possible of the incoming signal $\hat{x}(n)$.

The diagrams of FIG. 2 illustrate, by solid lines, the absolute values of the frequency responses of the analysing and synthesizing filter banks for the ideal case in which these filters have a steep cut-off slope and an infinite attenuation. The diagrams 2a, 2b, 2c illustrate the respective responses $H_0(f)$, $H_1(f)$, $H_{N-1}(f)$ of the filters 1-0, 1-1, 1-(N−1) of the analysing bank and the filters 4-0, 4-1, 4-(N−1) of the synthesizing bank. With filters having these ideal characteristics, the outgoing signal $\hat{x}(n)$ of the signal synthesizing bank constitutes a perfect replica of the incoming signal $\hat{x}(n)$. For physically realisable filters, having frequency responses of the type illustrated by dotted lines in the diagrams, the frequency responses of the different filters of each bank partly overlap and the outgoing signal $\hat{x}(n)$ comprises spurious terms due to spectral folding (aliasing).

In accordance with a prior art technique, for example the technique utilized in the above papers by Rothweiler and Nussbaumer, the filters of the analysing and synthesizing filter banks are obtained by modulating a prototype filter which, in a perfect case, has the characteristic of an ideal low-pass filter with a cut-off frequency $f_e/4$, diagram 3a of FIG. 3 representing the absolute value H(f) of the frequency response of such a filter. The modulation signals of the prototype filter are sinusoidal and have frequencies which are odd multiples of $f_e/4N$, that is to say $(2k+1)f_e/(4N)$, where k extends from 0 to N−1. The diagrams 3b, 3c, 3d show the spectra of these modulation signals for the respective modulation frequencies such as $k=0$, $k=1$ and $k=N-1$, by means of which it is possible to obtain the respective responses $H_0(f)$, $H_1(f)$, $H_{N-1}(f)$ shown in FIG. 2.

The prototype low-pass filter is implemented as a finite impulse response filter and obviously cannot have an inifite cut-off slope represented by the solid line response of diagram 3a. A physically realizable prototype filter must satisfy several requirements, which will be described hereinafter, so as to ensure that the complete analysing-synthesizing system performs its function. If $f_a$ denotes the beginning-of-attenuation-band frequency of the prototype filter, it can be demonstrated that the spurious spectral folding terms (or aliasing terms) appearing in the outgoing signal $\hat{x}(n)$ can be eliminated if $f_a \leq f_e/2N$. Diagram 3a shows by means of a dotted line the shape of the frequency response of a prototype filter satisfying this requirement. On the other hand, to ensure that the analysing-synthesizing system has a unitary frequency response and a linear phase (the system being equivalent to a simple delay) the prototype filter must be chosen to be symmetrical and is to satisfy the quadrature condition:

$$H^2(f) + H^2(f_e/2N - f) = 1 \quad (1)$$

where $0 \leq f \leq f_a$.

On the other hand, the modulation signals of the prototype filters of the frequencies $(2k+1)f_e/(4N)$ must satisfy the following phase requirements, which can be derived from the above-mentioned article by Rothweiler: the modulation signal producing the k-th subband must have the phase $\alpha_k$ for the analysing bank and the phase $-\alpha_k$ for the signal synthesizing bank, the phase $\alpha_k$ being such that for the subband of the order $k=0$ the phase $\alpha_o = \pi/4$, $3\pi/4$, $5\pi/4$ or $7\pi/4$ and such that for two contiguous subbands of the orders k and $k-1$ the difference $\alpha_k - \alpha_{k-1} = +\pi/2$ or $-\pi/2$. By way of example, it will be assumed hereinafter that $\alpha_o = \pi/4$ and $\alpha_k - \alpha_{k-1} = \pi/2$ so that $\alpha_k = (2k+1)\pi/4$.

However, in the known systems of Nussbaumer and Rothweiler, the number of coefficients $N_c$ of the prototype filter is of necessity linked with the number N of the subbands by a relation of the type $N_c = 2aN$ or $N_C = 2aN + 1$, a being an integer. This constitutes a serious restriction of the systems, for specifically when the number N of subbands is high, as, in order to satisfy one of these relations, one is generally forced to use for the prototype filter a number of coefficients $N_c$ which is higher than strictly necessary to obtain the required filtering characteristitics. On the other hand, these known systems are only described practically for the case in which the number N of subbands is a power of 2, whereas for example a number of subbands such as 12 seems to be well-suited for subdividing the 4 kHz band of a telephone signal. All things considered, the prior art signal analysing and synthesizing systems are not flexible and very often do not allow an optimum reduction of the number of calculations and memories.

The present invention permits of obviating these disadvantages by an optimum handling of the case of a number of subbands differing from a power of two with a number of coefficients of the prototype filter independent of the number of subbands.

According to the invention, the modulation signals are furthermore delayed by a time $\tau = (N_c - 1)/(2f_e)$.

Thus, taking account of all the requirements necessary for the modulation signals (frequency, phase and delay) and taking account of the fact that these signals are sampled at the rate $f_e$ (sampling instants $n/f_e$), one can easily see that the n-th coefficient $h_k(n)$ of the k-th filter of the analysing bank and the n-th coefficient $h'_k(n)$ of the k-th filter of the synthesizing bank can be derived from the n-th coefficient $h(n)$ of the prototype filter, in accordance with the expressions:

$$h_k(n) = 2 \cos\left[2\pi \frac{2k+1}{4N} \left(n - \frac{N_c - 1}{2}\right) \frac{\pi}{4}\right] \cdot h(n), \text{ and} \quad (2)$$

$$h'_k(n) = \quad (3)$$

$$2 \cos\left[2\pi \frac{2k+1}{4N} \left(n - \frac{N_c - 1}{2}\right) - (2k+1)\frac{\pi}{4}\right] \cdot h(n).$$

In these expressions (2) and (3), the above-mentioned case where $\alpha_k = (2k+1)\pi/4$ has been taken by way of example. On the other hand, these expressions are valid for the N values of k extending from 0 to $N-1$ and for the $N_c$ values of n extending from 0 to $N_c - 1$.

These formulae show more specifically that the coefficients $h_k(n)$ and $h'_k(n)$ of the analysing and synthesizing filters depend on the number $N_c$ of coefficients of the prototype filter, this number Nc having any possible value and being determined more specifically so as to satisfy the requirements as regards the steepness of the cut-off slope. In known systems, this number Nc is linked to the number N by the above-defined relations and does not appear in the known corresponding formulae (see for example said article by Nussbaumer, formula (1)). Put differently, it can be said that, in the known systems, the filters determined by the coefficients $h_k(n)$ and $h'_k(n)$ must each be symmetrical (have a linear phase), whereas there is no such requirement in the system according to the invention, provided that each couple of cascade-arranged filters $h_k(n)$ and $h'_k(n)$ behaves as a linear-phase filter.

Now it will be demonstrated that the system according to the invention shown in FIG. 1, provided with analysing and synthesizing filters have respective coefficients $h_k(n)$ and $h'_k(n)$ defined by the formulae (2) and (3), performs its function by substantially eliminating the spectral folding terms (aliasing terms) and by substantially behaving as a pure delay.

To that end, first the equations linking the input and output signals of the system $\tilde{x}(n)$ and $\hat{x}(n)$, as a function of the filters having the coefficients $h_k(n)$ and $h'_k(n)$, will be described.

The calculations are effected in the Z-domain where:

$$Z = e^{-2\pi j/T} \text{ with } j^2 = -1, T = 1/f_e.$$

It should be noted that: $W = e^{-2\pi j/N}$.

In accordance with common practice, the transformed variables in the Z-domain are written with capital letters.

The signal $x_k$ of the k-th subband produced by the analysing bank is obtained by filtering the input signal with the aid of the filters having the coefficients $h_k(n)$, followed by a down-sampling operation by a factor 1/N with the aid of an arrangement 2−k. This down-sampling operation conveys the useful signal of the k-th subband to the baseband $(-f_e/2N, +f_e/2N)$, but also all the imperfectly filtered components of the signal which represent the spectral folding terms (aliasing term). In the Z-domain, this signal $x_k$ can be written as:

$$\tilde{x}_k(Z^N) = \sum_{u=0}^{N-1} H_k(W^u Z) \cdot X(W^u Z).$$

The value $u = 0$ of the variable u provides the contribution of the useful signal in the signal of the subband k as conveyed to the baseband. The values $u = 1$ to $N-1$ provide the contributions of the spurious components aliased to the baseband and coming from other subbands.

After an up-sampling operation by a factor of N by adding zeroes in an arrangement, 3−k, the transformed signal of the subband becomes:

$$\hat{X}_k(Z) = \sum_{u=0}^{N-1} H_k(W^u Z) \cdot X(W^u Z).$$

The signal of the subband k, filtered by the synthesizing filter having coefficients h′$_k$(n), is then written in the transform domain as:

$$\hat{X}_k(Z) = H'_k(Z) \sum_{u=0}^{N-1} H_k(W^u Z) \cdot X(W^u Z).$$

The Z-transform of the signal $\hat{x}(n)$ coming from the synthesizing bank can then be written:

$$\hat{X}(Z) = \sum_{k=0}^{N-1} H'_k(Z) \sum_{u=0}^{N-1} H_k(W^u Z) \cdot X(W^u Z). \quad (20)$$

By assuming that:

$$G_u(Z) = \sum_{K=0}^{N-1} H'_k(Z) \cdot H_k(W^u Z), \quad (4)$$

it is possible to write:

$$\hat{X}(Z) = \sum_{u=0}^{N-1} G_u(Z) \cdot X(W^u Z). \quad (5)$$

To ensure that the overall analysing-synthesizing system is equivalent to a pure delay DT, the condition must be satisfied that $\hat{X}(Z) = Z^{-3} \cdot X(Z)$, that is say in accordance with (5):

$$\begin{bmatrix} G_0(Z) = Z^{-D} \\ G_u(Z) = 0 \text{ for } 1 \leq u \leq N-1 \end{bmatrix} \quad (6)$$

From the relations (2) and (3), which give the expressions of the coefficients h$_k$(n) and h′$_k$(n), it is easy to derive that their respective Z-transforms can be written as:

$$H_k(Z) = e^{j\phi k} \cdot H\left(W^{\frac{2k+1}{4}} Z\right) + \quad (7)$$

$$e^{-j\phi k} \cdot H\left(W^{-\frac{2k+1}{4}} Z\right); \text{ and}$$

$$H'_k(Z) = e^{j\psi k} \cdot H\left(W^{\frac{2k+1}{4}} Z\right) + \quad (8)$$

$$e^{-j\psi k} \cdot H\left(W^{-\frac{2k+1}{4}} Z\right),$$

where:

$$\left.\begin{array}{l} \phi_k = (N - N_c + 1)\dfrac{(2k+1)\pi}{4N} \\ \psi_k = (-N - N_c + 1)\dfrac{(2k+1)\pi}{4N} \end{array}\right\} \quad (9)$$

These expressions for H$_k$(Z) and H′$_k$(Z) can be transferred to the expression (4) for G$_u$(Z).

Now first the case in which u=0 will be described. By replacing W and Z in the expression (4) by their respective values, it can be demonstrated that $$G_0(f) = e^{-2\pi j f(N_c-1)T} .$$

$$\left(\sum_{k=0}^{N-1}\left[H^2\left(f - \frac{2k+1}{4N} f_e\right) + H^2\left(f + \frac{2k+1}{4N} f_e\right)\right]\right)$$

where H(f) is the absolute value of the frequency response of the prototype filter. It is easy to check that the quadrature condition of the prototype filter defined in formula (1), renders it possible to satisfy the relation:

$$H^2\left(f - \frac{2k+1}{4N} f_e\right) + H^2\left(f + \frac{2k+1}{4N} f_e\right) = 1$$

whatever the value of k may be.
From this it follows that:

$$G_0(f) = e^{-2\pi j f(N_c-1)T}$$

which implies that the useful value of the output signal $\hat{X}(Z)$ is the incoming signal $X(Z)$, delayed by a time $DT = (N_c - 1)T$, which is equal to double the delay produced by the prototype filter having N$_c$ coefficients.

Now the case will be examined in which u=1 to N−1, for which it will be demonstrated that G$_u$(Z)=0, which means that in the output signal $\hat{X}(Z)$ the spurious components due to spectral folding are eliminated.

Taking account of the relations (7) and (8), the expression (4) for G$_u$(Z) can be written as:

$$G_u(Z) = \sum_{k=0}^{N-1} \left\{ e^{j(\phi k + \psi k)} \cdot H\left(W^{\frac{4u+2k+1}{4}} Z\right) \right.$$

$$H\left(W^{\frac{2k+1}{4}} Z\right) + e^{j(\phi k - \psi k)} \cdot H\left(W^{\frac{4u+2k+1}{4}} Z\right)$$

$$H\left(W^{-\frac{2k+1}{4}} Z\right) + e^{-j(\phi k - \psi k)} \cdot H\left(W^{\frac{4u-2k-1}{4}} Z\right)$$

$$H\left(W^{\frac{2k+1}{4}} Z\right) + e^{-j(\phi k + \psi k)} \cdot$$

$$\left. H\left(W^{\frac{4u-2k-1}{4}} Z\right) \cdot H\left(W^{-\frac{2k+1}{4}} Z\right) \right\}$$

Now there appear terms of the type H(W$^{p/4}$Z).H(W$^{q/4}$Z) which correspond to the products of the two filters derived from the prototype filter, one by a translation over pf$_e$/4N and the other by a translation over qf$_e$/4N. Assuming the attenuation of the prototype filter to be sufficiently high (at least 40 dB), the terms may be neglected for which p and q are such that there are no overlapping zones between H(W$^{p/4}$Z) and H(W$^{q/4}$Z), inclusive of the passbands and transition bands. Only those terms of the type $H(W^{p/4}Z) \cdot H(W^{q/4}Z)$ subsist for which p and q are such that overlap occurs, that is to say such that $k=u$ and $k=u-1$ (which corresponds to two contiguous subbands). It is then possible to demonstrate that the last expression for $G_u(Z)$ can be simplified as follows:

$$G_u(Z) = H\left(-W^{\frac{2u+1}{4}}Z\right).$$

$$H\left(-W^{\frac{2u-1}{4}}Z\right)[e^{j(\phi N-u-\psi N-u)} +$$

$$e^{j(\phi N-u-1-\psi N-u-1)}] + H\left(W^{\frac{2u+1}{4}}Z\right)H\left(W^{\frac{2u-1}{4}}Z\right)$$

$$[e^{-j(\phi u-\psi u)} + e^{-j(\phi u-1-\psi u-1)}]$$

By replacing the terms $\phi_u$, $\psi_u$, $\phi_{N-u}$, $\psi_{N-u}$, etc. by their values given in (9) for $u=k$, it is found that $G_u(Z)=0$ for $1 \leq u \leq N-1$, which is the relation to be verified so as to ensure that the spectral folding terms are cancelled in the outgoing signal of the synthesizing bank.

In practice, it has been possible to realize an analysing-synthesizing system which divides the 4 kHz band of a speech signal, which is sampled at 8 kHz, into 12 subbands having widths $f_e/2N=333$ Hz with a prototype filter having a number of coefficients $N_c=66$ for obtaining an attenuation of 3 dB at the frequency $f_e/4N=166$ Hz and an attenuation increasing to over 40 dB above the frequency $f_e/2N=333$ Hz, the quadrature condition (1) being satisfied in the band from 0 to 333 Hz.

Now it will be shown how the signal analysing and synthesizing filters of the system according to the invention can be implemented in a particularly effective manner, in accordance with the block diagrams shown in FIG. 4. In accordance with block diagram 4a representing the analysing bank, the incoming signal x(n) sampled at the rate $f_e$ is applied to a commutator circuit 10 which cyclically distributes the samples of x(n) over N branches 11-$\rho$ ($\rho$ extending from 0 to N−1), so that the sampling rate in each branch is reduced to $f_e/N$). The N signals in the branches 11-$\rho$ are applied to a polyphase analysing network 12, at whose input the respective signal samples are assumed to be adjusted to the correct phase and in which they are subjected to a processing operation which will be explained hereinafter. The N outgoing signals of the branches 13-$\rho$ of the polyphase network 12 are applied to a processing arrangement 14, which calculates a double-odd discrete cosine transform as will be described in greater detail hereinafter. The N outgoing signals of the processing arrangement 14 constitute the down-sampled outgoing signals (sample rate $f_e/N$) of the analysing bank which are denoted by $x_0$ to $x_{N-1}$ in FIG. 1. In diagram 4a these signals are designated for convenience by $X_k(m)$, k extending from 0 to N−1 characterizing the subband of a signal and m characterizing the sampling instant.

As shown in diagram 4b representing the synthesizing bank, the N outgoing signals $X_k(m)$ of the signal analysing bank are applied to a processing arrangement 15, which calculates a double-odd discrete cosine transform which will be described in greater detail hereinafter. The N output going signals of the processing arrangement 15 are applied to input branches 16-$\rho$ of a synthesizing polyphase network 17 in which they are subjected to a processing operation which will be described in greater detail hereinafter. The N signals appearing at the output branches 18-$\rho$ of the polyphase network 17 are sampled at the reduced rate $f_e/N$ and have samples which may be assumed to be in-phase in the N branches. These N signals are applied to the respective N inputs of a commutator circuit 19, which distributes the respective signal samples in the time so as to form at its output a signal sampled at the rate $f_e$ which constitutes the outgoing signal $\hat{x}(n)$ of the signal synthesizing bank.

The following description explains how the structures 4a and 4b render it possible to realize the respective operations to be effected in the signal analysing and synthesizing banks.

This description will first be given for the analysing bank. At each instant mNT the signal $X_k(m)$ of the subband k formed by the signal analysing bank results from a convolution between the $N_c$ coefficients $h_k(n)$ of the filter determining this subband and $N_c$ consecutive samples of the signal entered in the analysing bank up to the instant mNT. Consequently, this signal $X_k(m)$ can be written as:

$$X_k(m) = \sum_{n=0}^{N_c-1} h_k(n) \cdot x(mN - n) \quad (10)$$

It is assumed that:

$$\lambda = E\left[\frac{N + N_c - 1}{N}\right] \quad (10a)$$

where $E(x)$ represents the integral part of x.

In the expression (10) it is possible to effect a change in the variables permitting to determine the variable n by two other variables r and $\rho$, such that:

$$n = rN + \rho$$

where $\rho$ varies from 0 to N−1 and r varies from 0 to $\lambda-1$.

It should be noted that with the complete excursion of the variables r and $\rho$, the variable n varies from 0 to $\lambda N-1$. If, as the present invention permits, the number $N_c$ of the coefficients $h_k(n)$ is less than $\lambda N$, the values of $h_k(n)$ for n going from $N_c$ to $\lambda N-1$ must be chosen equal to zero, these zero values being symmetrically distributed at the two ends of the impulse response $h_k(n)$ implying that $\lambda N - N_c$ is even.

With this change in the variables and by using for the coefficients $h_k(n)$ the values given by the expression (2), expression (10) for $X_k(m)$ becomes:

$$X_k(m) = \sum_{\rho=0}^{N-1} \sum_{r=0}^{\lambda-1} \cos\left[\frac{(2k+1)(2\rho+1+N)\pi}{4N} + (2k+1)(2r-\lambda)\frac{\pi}{4}\right] h(rN+\rho) \cdot x[(m-2)N-\rho] \quad (11)$$

This formula (11) can be written differently by using the following notations:

$$\left.\begin{array}{l}\hat{h}_\rho(r) = h(rN + \rho) \\ x_\rho(r) = x(rN - \rho) \\ C_N(k,\rho) = 2\cos\left[\dfrac{(2k+1)(2\rho+1)}{4N}\pi\right] \\ S_N(k,\rho) = 2\sin\left[\dfrac{(2k+1)(2\rho+1)}{4N}\pi\right]\end{array}\right\} \quad (12)$$

With these notations it is possible to demonstrate that the expression (11) can be written in the following form, where λ and N are even:

$$X_k(m) = \sum_{\rho=0}^{N-1}\sum_{r=0}^{\lambda-1}\left[C_N\left(k,\rho + \dfrac{N}{2}\right)\cos\left((2r - \lambda)\dfrac{\pi}{4}\right)\cdot \hat{h}_\rho(r)\cdot x_\rho(m-r) - C_N\left(k,\rho - \dfrac{N}{2}\right)\sin(2r-\lambda)\dfrac{\pi}{4}\cdot \hat{h}_\rho(r)\cdot x_\rho(m-r)\right] \quad (13)$$

Assuming that:

$$\left.\begin{array}{l}P_\rho^{(1)}(m) = \sum_{r=0}^{\lambda-1}\hat{h}_\rho(r)\cos\left((2r-\lambda)\dfrac{\pi}{4}\right)\cdot x_\rho(m-r) \\ P_\rho^{(2)}(m) = \sum_{r=0}^{\lambda-1}\hat{h}_\rho(r)\sin\left((2r-\lambda)\dfrac{\pi}{4}\right)\cdot x_\rho(m-r)\end{array}\right\} \quad (14)$$

the expression (13) becomes:

$$X_k(m) = \sum_{\rho=0}^{N-1} C_N\left(k,\rho + \dfrac{N}{2}\right)\cdot P_\rho^{(1)}(m) + \sum_{\rho=0}^{N-1} C_N\left(k,\rho + \dfrac{N}{2}\right)\cdot P_\rho^{(2)}(m) \quad (15)$$

By using the following properties of the function $C_N(k,\rho)$:

$$\begin{cases} C_N\left(k,\rho + \dfrac{N}{2}\right) = -C_N\left(k, N-1-\left(\rho-\dfrac{N}{2}\right)\right) \\ C_N\left(k,\rho - \dfrac{N}{2}\right) = C_N\left(k, N-1-\left(\rho+\dfrac{N}{2}\right)\right)\end{cases}$$

it is possible to demonstrate that the expression (15) can be written:

$$X_k(m) = \sum_{\rho=0}^{N-1} C_N(k,\rho)\cdot P_\rho(m) \quad (16)$$

where:

-continued $$\left.\begin{array}{l}P_\rho(m) = P^{(2)}_{\frac{N}{2}-1-\rho}(m) + \\ P^{(2)}_{\frac{N}{2}+\rho}(m) \text{ for } 0 \leq \rho \leq \dfrac{N}{2}-1 \\ P_\rho(m) = P^{(1)}_{\rho-\frac{N}{2}}(m) - \\ P^{(1)}_{\frac{3N}{2}-\rho-1}(m) \text{ for } \dfrac{N}{2} \leq \rho \leq N-1\end{array}\right\} \quad (17)$$

Now the results will be given which are obtained in the cases of different artities for λ and N.

• λ even and N odd:

$$X_k(m) = \sum_{\rho=0}^{N-1} C_N(k,\rho)\ P_\rho(m)$$

where:

$$C_N(k,\rho) = 2\cos\left[\dfrac{(2k+1)}{2N}\rho - \pi\right]$$

and $$\begin{bmatrix} P_0(m) = P^{(2)}_{\frac{N-1}{2}}(m) \\ P_\rho(m) = -P^{(2)}_{\frac{N-1}{2}-\rho}(m) + P^{(2)}_{\frac{N-1}{2}+\rho}(m) \\ \text{for } 1 \leq \rho \leq \dfrac{N-1}{2} \\ P_\rho(m) = P^{(1)}_{\frac{N+1}{2}}(m) - P^{(1)}_{\frac{3N-1}{2}}(m) \\ \text{for } \dfrac{N+1}{2} \leq \rho \leq N-1 \end{bmatrix}$$

and where $P_\rho^{(1)}$ and $P_\rho^{(2)}$ are given by the formulae (14).

• λ odd, any parity for N:

$$X_k(m) = \sum_{\rho=0}^{N-1} C_N(k,\rho)\ P_\rho(m)$$

where $$P_\rho(m) = \sum_{r=0}^{\lambda-1} h_\rho(r)\left[\cos\left[(2r-\lambda+1)\dfrac{\pi}{4}\right]x_\rho(m-r) + \sin\left[(2r-\lambda+1)\dfrac{\pi}{4}\right]x_{N-1-\rho}(m-\lambda+r+1)\right]$$

The remaining part of the description of the signal analysing bank will be given by way of example for the case where λ and N are even.

Thus, the calculations to be effected in the analysing bank in order to obtain the sub-band signals $X_k(m)$ can be divided in two distinct portions:

In a first filtering portion, the formulae (17) completed with the formulae (14) are used for calculating the signals $P_\rho(m)$ from the filtering coefficients $\hat{h}_\rho(r)$ and samples $x_\rho(m-r)$ of the incoming signal of the analysing bank, $\hat{h}_\rho(r)$ and $x_\rho(m-r)$ being defined in the formula (12). This first portion of the calculations is realized in the analysing polyphase network 12 shown in FIG. 4a;

In a second modulation portion which puts the formula (16) into effect, the signals $P_\rho(m)$ are modulated with the aid of a double-odd discrete cosine transform having the coefficients defined in the third formula (12). This second stage is realized in the arrangement 14.

Now a block diagram for carrying out the calculations effected in the polyphase network 12 for forming the signals $P_\rho^{(1)}(m)$ and $P_\rho^{(2)}(m)$ will be described with reference to FIG. 5. This block diagram is given for the above-mentioned case where the number N of subbands to be realized is N=12 and the number $N_c$ of coefficients of the prototype filter is $N_c=66$. For these values of N and $N_c$, the parameter $\lambda$ defined in formula (10a) has the value 6. Thus, the variables $\rho$ and r defined in the foregoing vary for $\rho$: from 0 to 11 for r: from 0 to 5.

Figure 5:
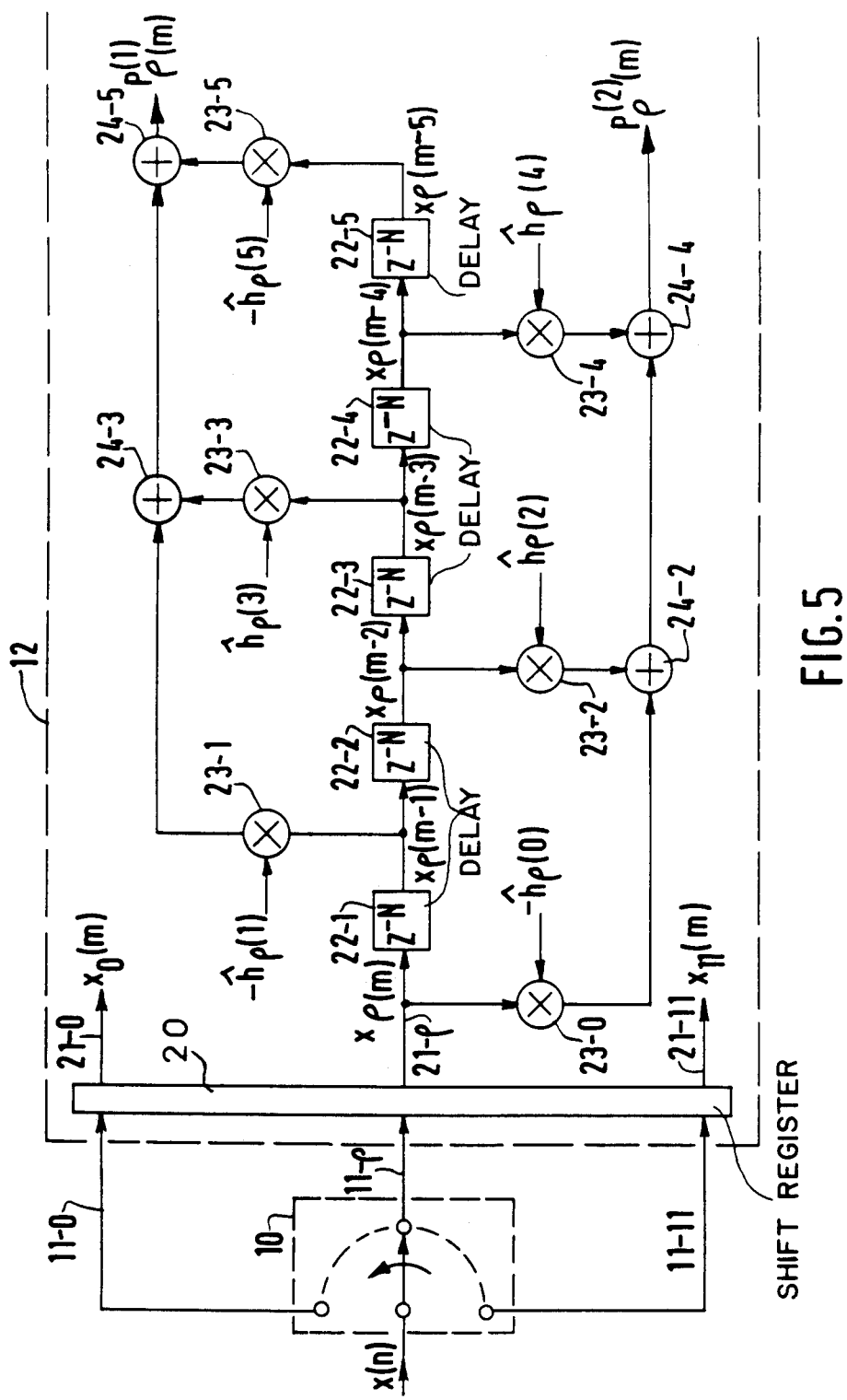
FIG. 5 shows an embodiment of a first portion of the analysing polyphase network.

The block diagram of FIG. 5 comprises the commutator circuit 10 already shown in FIG. 4 which cyclically distributes the samples of the input signal x(n) over 12 branches 11-$\rho$ ($\rho$ varying from 0 to 11) constituting the inputs of the polyphase network 12. A shift register 20 is used in a well-known manner for re-adjusting the samples distributed over the 12 input branches to the proper phase and thus supplies in the branches 21-$\rho$ the signals $x_\rho(m)$ whose samples are in-phase and are produced at the instants mNT. The block diagram show only the arrangement connected to the branch 21-$\rho$ for processing the signal $x_\rho(m)$ and for forming the signals $P_\rho^{(1)}(m)$ and $P_\rho^{(2)}(m)$ in accordance with the calculations shown in formula (14), it being understood that similar arrangements must be connected to the 12 branches 21-0 to 21-11 for forming these signals for all values of $\rho$.

The branch 21-$\rho$ is connected to a delay line constituted by circuits 22-1 to 22-5, each of which produces a delay NT (represented by the function $Z^{-N}$). The samples $x_\rho(m)$ to $x_\rho(m-5)$ are available at the input of the delay line and at the output of the circuits 22-1 to 22-5, respectively, that is to say the samples $x_\rho(m-r)$ (r varying from 0 to 5) required for applying the formulae (14). These samples $x_\rho(m)$ to $x_\rho(m-5)$ are applied to respective inputs of multipliers 23-0 to 23-5 to be multiplied by the respective coefficients $-\hat{h}_\rho(0)$, $-\hat{h}_\rho(1)$, $\hat{h}_\rho(2)$, $\hat{h}_\rho(3)$, $-\hat{h}_\rho(4)$, $-\hat{h}_\rho(5)$. It can be verified that $-\hat{h}_\rho(1)$, $\hat{h}_\rho(3)$, $-\hat{h}_\rho(5)$ are the only non-zero terms obtained by having r vary from 0 to 5 in the factor $\hat{h}_\rho(r) \cdot \cos(2r-\lambda)\pi/4$ of the first formula (14). It can also be verified that $-h_\rho(0)$, $h_\rho(2)$, $-h_\rho(4)$ are the only non-zero terms obtained by having r vary from 0 to 5 in the factor $-\hat{h}_\rho(r) \cdot \sin[(2r-\lambda)\pi/4]$ of the second formula (14). All these non-zero terms are derived from the coefficients of the prototype filter $\hat{h}_\rho(r)$ defined in the foregoing.

Applying the first formula (14), the products formed by the multipliers 23-1, 23-3 and 23-5 are added together with the aid of adders 24-3 and 24-5 and the sum thus obtained constitutes the desired value of the signal $P_\rho^{(1)}(m)$. By applying the second formula (14), the products formed by the multipliers 23-0, 23-2 and 23-4 are added together with the aid of adders 24-2 and 24-4 and the sum thus obtained constitutes the desired value of the signal $P_\rho^{(2)}(m)$.

It should be noted that the structure of the polyphase network shown in FIG. 5 having a total of 12 branches which are similar to those connected to the branch 21-$\rho$, renders it possible to use a prototype filter having up to 72 coefficients ($\lambda \cdot N = 72$). In the present case, in which this number of coefficients of the prototype filter is 66, there are 6 coefficients $h_\rho(r)$ used in the polyphase network which will have zero values, these zero-value coefficients which correspond to the two ends of the impulse response of the prototype filter being: $\hat{h}_0(0) = \hat{h}_1(0) = \hat{h}_2(0) = \hat{h}_9(5) = \hat{h}_{10}(5) = \hat{h}_{11}(5) = 0$.

Figure 6:
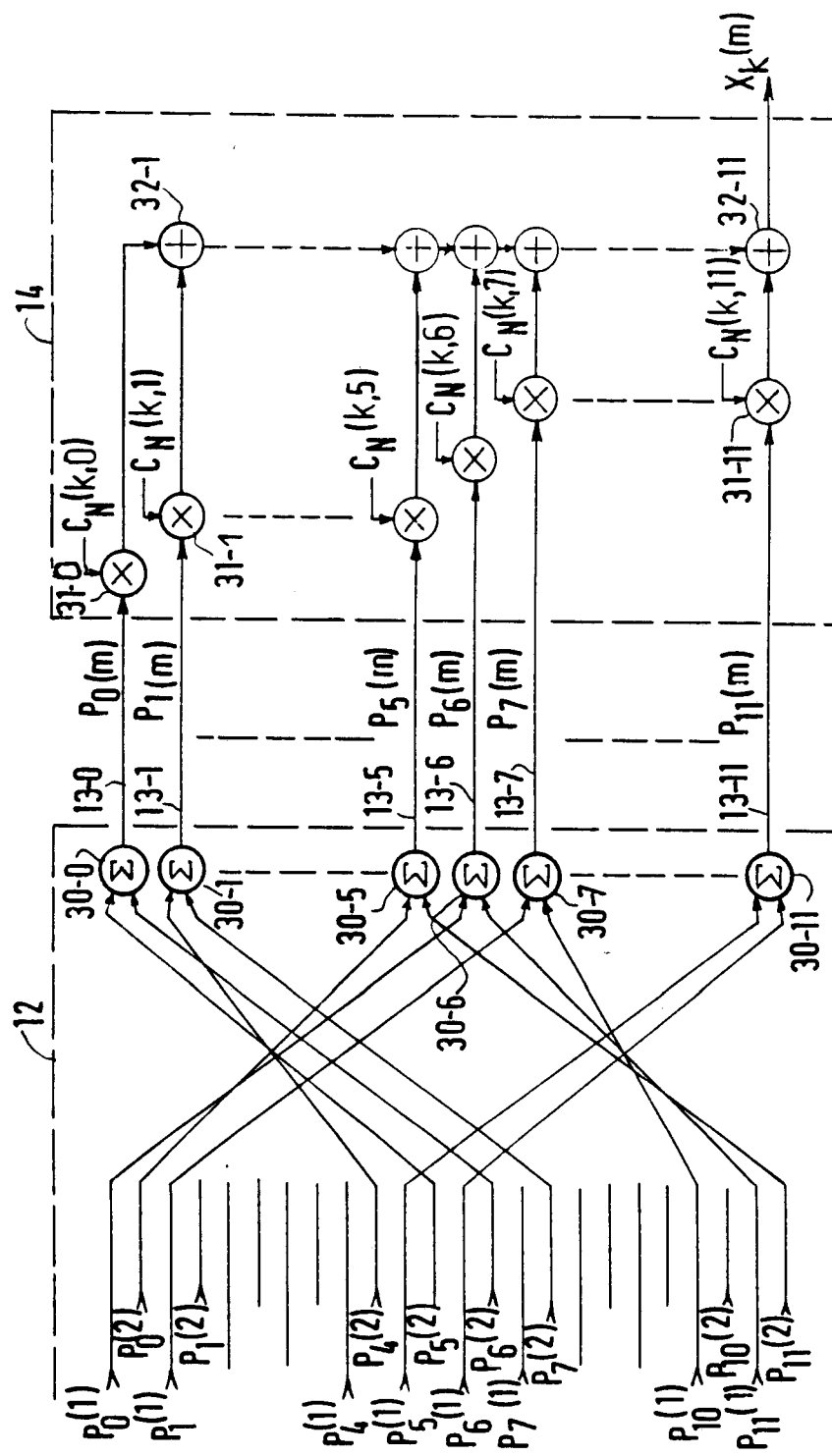
FIG. 6 shows an embodiment of the final portion of the analysing polyphase network and the associated discrete cosine transform calculating arrangement.

The block diagram shown in FIG. 6 is given for the same case as the block diagram of FIG. 5: N=12, $N_c=66$. It comprises the final portion of the polyphase network 12 provided with 12 output branches 13-$\rho$ and used to form in accordance with the formula (17) the 12 signals $P_\rho(m)$ from the signals $P_\rho^{(1)}(m)$ and $P_\rho^{(2)}(m)$, which are calculated in a manner as described with reference to FIG. 5. The block diagram of FIG. 6 includes thereafter the double-odd discrete cosine transform calculation arrangement 14 to which the 12 signals $P_\rho(m)$ are applied and which has for its object to form the 12 desired sub-band signals $X_k(m)$.

The block diagram of FIG. 6 shows on the left 24 branches to which the 12 pairs of signals $P_\rho^{(1)}(m)$ and $P_\rho^{(2)}(m)$ are applied. The adders 30-0 to 30-5 receive the signals indicated in FIG. 6 for forming, in accordance with the first formula (17), the 6 signals $P_0(m)$ to $P_5(m)$ based on the 12 signals $P_0^{(2)}(m)$ to $P_{11}^{(2)}(m)$. The subtractors 30-6 to 30-11 receive the signals indicated in FIG. 6 for forming, in accordance with the second formula (17), the 6 signals $P_6(m)$ to $P_{11}(m)$ on the basis of the 12 signals $P_0^{(1)}(m)$ to $P_{11}^{(1)}(m)$.

In the arrangement (14) for calculating the discrete cosine transform utilizing formula (16), the 12 signals $P_0(m)$ to $P_{11}(m)$ available at the output branches 13-$\rho$ of the polyphase network 12 are applied to respective multipliers 31-0 to 31-11 in order to be multiplied by the respective coefficients $C_N(k, 0)$ to $C_N(k, 11)$. These coefficients are determined with the aid of the third formula of the set of formulae (12) and depends on the number k of the subband. By the odd factors $(2k+1)$ and $(2\rho+1)$ figuring in this formula, the coefficients $C_N(k, \rho)$ are characteristic of a double-odd discrete cosine transform. The adders 32-1 to 32-11 are connected in such a way as to form the sum of the products produced by the multipliers 31-0 to 31-11, this sum constituting the signal $X_k(m)$ of the subband k, in accordance with formula (16). All the subbands signals $X_0(m)$ to $X_{11}(m)$ to be produced by the analysing bank are formed in the same manner, by employing the coefficients $C_N(k, 0)$ to $C_N(k, 11)$ where k varies from 0 to 11.

Now it will be described how the synthesizing bank can be realised in accordance with the structure of FIG. 4b.

The output signal $\hat{x}(n)$ of the synthesizing bank may be considered as being the result of the interleaving of N down-sampled signals $\hat{x}(mN+\rho)$, where m characterizes the sampling instants produced at the rate $f_e/N$ and $\rho$, which varies from 0 to N−1, characterizes each down-sampled signal. The following description will basically determine the operations to be effected for obtaining each down-sampled signal $\hat{x}(mN+\rho)$, denoted as $\hat{x}_\rho(m)$.

To determine these operations, it is assumed, just as in the analysing bank that $n = rN + \rho$, where r varies from 0 to $\lambda - 1$, $\lambda$ being defined as indicated in formula (10a).

At each instant mNT, a signal $\hat{x}_\rho(m)$ results from the sum of the N signals which are each formed by filtering a subband signal $\hat{X}_k(m)$ with the aid of the $\lambda$ coefficients of a synthesizing filter defined by its coefficients $\hat{h}_k(n)$. To put it more accurately, a signal $\hat{x}_\rho(m)$ can be calculated in accordance with the expression:

$$\hat{x}_\rho(m) = \sum_{k=0}^{N-1}\sum_{r=0}^{\lambda-1} h'_k(rN + \rho) \cdot X_k(m - r) \quad (18)$$

where $X_k(m-r)$ represents $\lambda$ samples produced in the subband k up to the instant mNT and $h'_k(rN+\rho)$ represents an assembly characterized by a number $\rho$ of the $\lambda$ coefficients of the synthesizing filter of the subband k.

By utilizing for the coefficients $h'_k(rN+\rho)$ the values given by the expression (3) and by utilizing the notations in formulae (12), it can be demonstrated, using calculations similar to those effected for the analysing bank that the expression (18) can be written in the following form for the case in which $\lambda$ and N are even:

$$\hat{x}_\rho(m) = \sum_{r=0}^{\lambda-1} \hat{h}_\rho(r)\left[ \cos\left((2r - \lambda)\frac{\pi}{4}\right) \cdot Y^{(m-r)}_{\frac{N}{2}-1-\rho} + \sin\left((2r - \lambda)\frac{\pi}{4}\right) \cdot Y^{(m-r)}_{\frac{N}{2}+\rho} \right] \quad (19)$$

for $0 \leq \rho \leq \frac{N}{2} - 1$ and $$\hat{x}_\rho(m) = \sum_{r=0}^{\lambda-1} \hat{h}_\rho(r)\left[ \cos\left((2r - \lambda)\frac{\pi}{4}\right) \cdot Y^{(m-r)}_{\rho-\frac{N}{2}} - \sin\left((2r - \lambda)\frac{\pi}{4}\right) \cdot Y^{(m-r)}_{\frac{3N}{2}-\rho-1} \right] \quad (20)$$

for $\frac{N}{2} \leq \rho \leq N - 1$ where $$Y_\rho(m) = \sum_{k=0}^{N-1} C_N(k,\rho) \cdot X_k(m) \quad (21)$$

By making use of the symmetry of the prototype filter $h(n)$ expressed by $\hat{h}(r) = \hat{h}_{N-1-\rho}(\lambda-r-1)$, the expression (20) can be written:

$$\hat{x}^{(m)}_{N-1-\rho} = \sum_{r=0}^{\lambda-1} \hat{h}_\rho(r)\left[ \cos\left((\lambda - 2r - 2)\frac{\pi}{4}\right) \cdot Y^{(m-\lambda+r+1)}_{\frac{N}{2}-1-\rho} - \sin\left((\lambda - 2r - 2)\frac{\pi}{4}\right) \cdot Y^{(m-\lambda+r+1)}_{\frac{N}{2}+\rho} \right] \quad (22)$$

for $0 \leq \rho \leq \frac{N}{2} - 1$

Now the results will be given which are obtained in the case, in which the parities of $\lambda$ and N are different.

• $\lambda$ even and N odd:

$$\hat{x}_\rho(m) = \sum_{r=0}^{\lambda-1} \hat{h}_\rho(r)\left[ \cos\left((2r - \lambda)\frac{\pi}{4}\right) y_{\frac{N-1}{2}-\rho}(m - r) + \sin\left((2r - \lambda)\frac{\pi}{4}\right) y_{\rho+\frac{N+1}{2}}(m - r) \right]$$

for $0 \leq \rho \leq \frac{N-1}{2}$ where $y_N(m) = 0$ whatever m $$\hat{x}_\rho(m) = \sum_{r=0}^{\lambda-1} \hat{h}_\rho(r)\left[ \cos\left((2r - \lambda)\frac{\pi}{4}\right) y_{\rho-\frac{N-1}{2}}(m - r) - \sin\left((2r - \lambda)\frac{\pi}{4}\right) y_{\frac{3N-1}{2}-\rho}(m - r) \right]$$

for $\frac{N+1}{2} \leq \rho \leq N - 1$ where $$y_\rho(m) = \sum_{k=0}^{N-1} C_N(k,\rho) X_k(m)$$

and $$C_N(k,\rho) = 2\cos\left[\frac{(2k + 1)}{2N}\rho - \pi\right]$$

• $\lambda$ odd, any parity of N:

$$\hat{x}_\rho(m) = \sum_{r=0}^{\lambda-1} \hat{h}_\rho(r)\left[ \cos\left((2r - \lambda - 1)\frac{\pi}{4}\right) y_\rho(m - r) - \sin\left((2r - \lambda - 1)\frac{\pi}{4}\right) y_{N-1-\rho}(m - r) \right]$$

where $y_\rho(m)$ is given by the expession (21).

As was also the case for the analysing bank, the following part of the description of the synthesizing bank will be given for the case in which $\lambda$ and N are even.

Thus, the calculations to be effected in the synthesizing bank in order to obtain the output signal $\hat{x}(n)$ can be divided in two distinct portions:

In a first modulation portion utilizing formula (21), the subband signals $X_k(m)$ are modulated with the aid of a double-odd discrete cosine transform for forming the signals $Y_\rho(m)$. This first portion is realized in the calculation arrangement 15 of FIG. 4b.

In a second filtering portion, the formulae (19) and (20) or (22) are utilized for calculating the signals $\hat{x}_\rho(m)$ from the filtering coefficients $\hat{h}_\rho(r)$ and signals $y_\rho(m)$ produced by the first portion. The second portion is realized in the polyphase synthesizing network 17 of FIG. 4b. The output signal $\hat{x}(n)$ is obtained by the time-distribution of the signals $\hat{x}_\rho(m)$.

Now a block diagram of an embodiment of the arrangement 15 for calculating the double-odd cosine transform will be described with reference to FIG. 7 for the said case where N=12 and $\lambda$=5, so that the variable $\rho$ varies from 0 to 6 and the variable r varies from 0 to 11.

Figure 7:
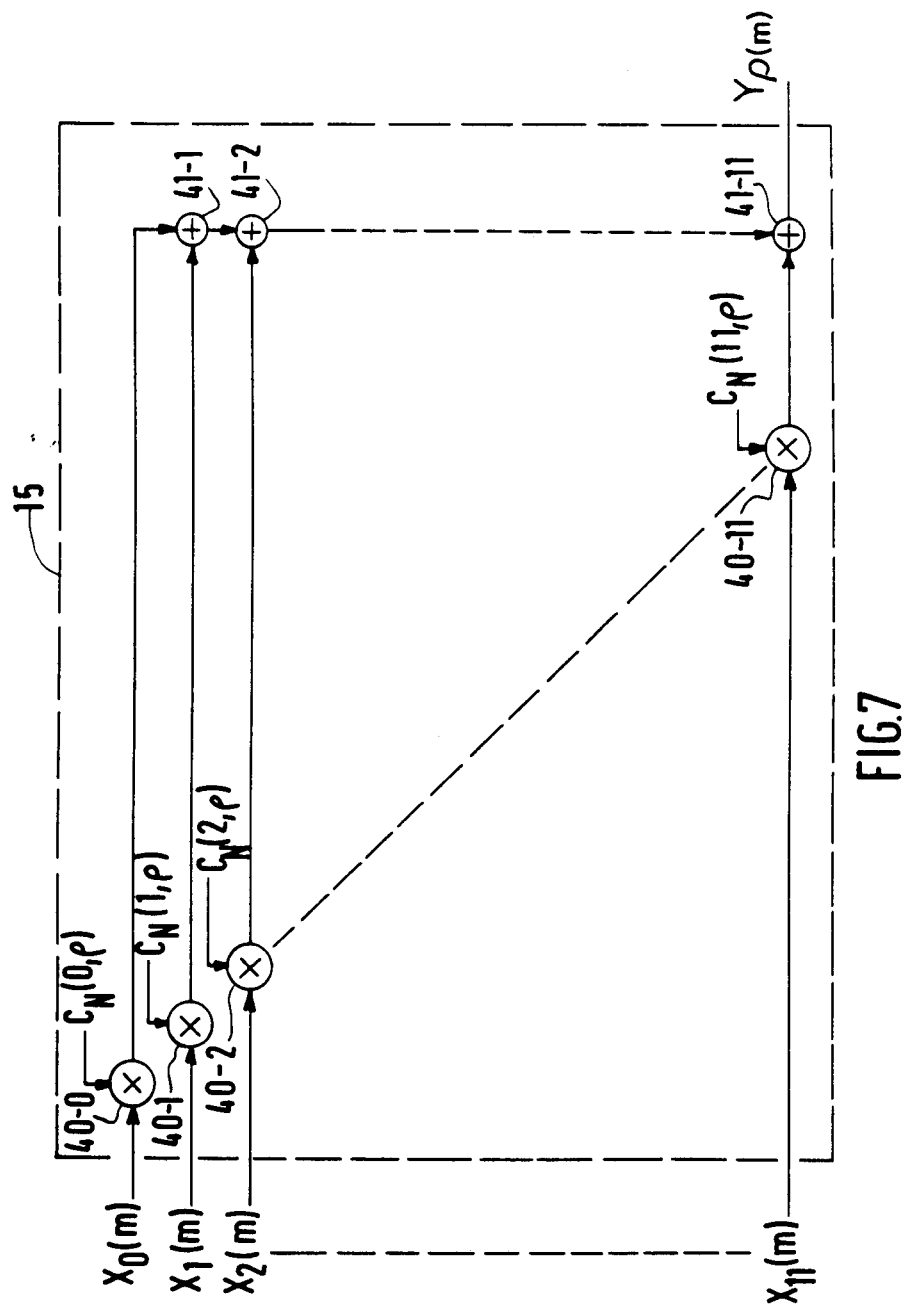
FIG. 7 shows an embodiment of the discrete cosine transform calculating arrangement, used for realizing the synthesizing bank.

In accordance with FIG. 7, the arrangement 15 has 12 input branches receiving the respective subband signals $\hat{X}_0(m)$ to $\hat{X}_{11}(m)$. These 12 subband signals are applied to respective multipliers 40-0 to 40-11 in order to be multiplied there by the coefficients $C_N(0, \rho)$ to $C_N(11, \rho)$ determined by the third of said formulae (12). Adders 41-1 to 41-11 are connected in such a way as to form the sum of the signals produced by the multipliers 40-0 to 40-11, this sum constituting the signal $y_\rho(m)$ determined in accordance with formula (21). By using the coefficients $C_N(0, \rho)$ to $C_N(11, \rho)$ for $\rho$ varying from 0 to 11, 12 signals $y_o(m)$ to $y_{11}(m)$ are obtained. It should be noted that the arrangements 14 and 15 of the analysing and synthesizing filter banks have the same structures and employ the same set of coefficients $C_N(k, \rho)$ which are characteristic of a double-odd discrete cosine transform.

Figure 8:
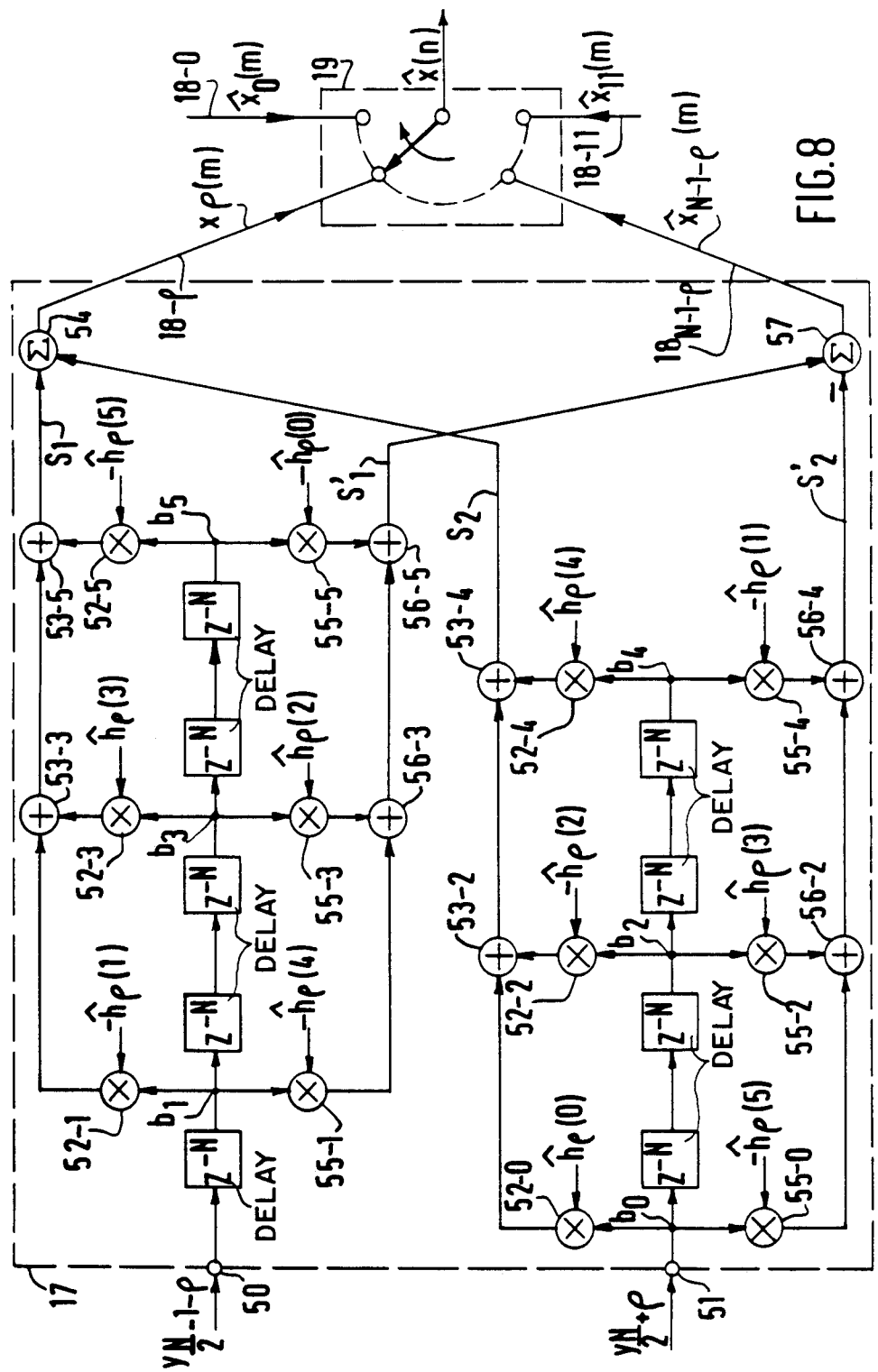
FIG. 8 shows an embodiment of the synthesizing polyphase network.

The block diagram of FIG. 8 effects in the polyphase network 17 the calculations defined by the expressions (19) and (22) for the case in which N=12 and $\lambda$=6. The use of the formulae (19) and (22) renders it possible to obtain for the same value of $\rho$ going from 0 to N/2−1 (0 to 5), the two signals $\hat{x}_\rho(m)$ and $\hat{x}_{N-1-\rho}(m)$.

The block diagram of the polyphase network 17 given for the current value of $\rho$ (varying between 0 and 5) has two inputs 50 and 51 receiving from the arrangement 15 the respective signals $$Y_{\frac{N}{2}-1-\rho}(m), \text{ i.e. } Y_{5-\rho}(m) \text{ and } Y_{\frac{N}{2}+\rho}(m), \text{ i.e. } Y_{6+\rho}(m).$$

A delay line formed from 5 elements each producing a time delay NT is connected to the input 50 and a delay line formed by 4 elements each producing a time delay NT is connected to the input 51. At the points $b_1$, $b_3$, $b_5$ of the delay line connected to the input 50 there are the respective samples $$Y_{\frac{N}{2}-1-\rho}(m-1), Y_{\frac{N}{2}-1-\rho}(m-3), Y_{\frac{N}{2}-1-\rho}(m-5),$$

which are representable by $Y_{\frac{N}{2}-1-\rho}(m-r)$ for $r = 1, 3, 5$.

At the points $b_0$, $b_2$, $b_4$ of the delay line connected to input 51 there are the respective samples $$Y_{\frac{N}{2}+\rho}(m), Y_{\frac{N}{2}+\rho}(m-2), Y_{\frac{N}{2}+\rho}(m-4),$$

representable by $Y_{\frac{N}{2}+\rho}(m-r)$ for $r = 0, 2, 4$.

The points $b_1$, $b_3$, $b_5$ are connected to respective inputs of multipliers 52-1, 52-3, 52-5. The other input of these multipliers receives the coefficients $-\hat{h}_\rho(1)$, $\hat{h}_\rho(3)$, $-\hat{h}_\rho(5)$ which represent the non-zero terms $\hat{h}_\rho(r) \cdot \cos[(2r-\lambda)\pi/4]$ appearing in formula (19), for r varying from 0 to $\lambda-1$, i.e. 0 to 5. The multipliers 52-1, 52-3, 52-5 produce products which are added together with the aid of adders 53-3, 53-5 for producing the first sum $S_1$ which renders it possible to calculate $\hat{x}_\rho(m)$ in accordance with the formula (19), i.e.:

$$S_1 = \sum_{r=0}^{\lambda-1} \hat{h}_\rho(r) \cos\left((2r - \lambda)\frac{\pi}{4}\right) \cdot Y_{\frac{N}{2}-1-\rho}(m - r).$$

Moreover, the points $b_0$, $b_2$, $b_4$ are connected to the respective inputs of multipliers 52-0, 52-2, 52-4. The other input of these multipliers receives the coefficients $\hat{h}_\rho(0)$, $-\hat{h}_\rho(2)$, $\hat{h}_\rho(4)$, which represent the non-zero terms $\hat{h}_\rho(r) \cdot \sin[(2r-\lambda)\pi/4]$, appearing in formula (19), for varying from 0 to $\lambda-1$, i.e. from 0 to 5. The multipliers 52-0, 52-2, 52-4 produce products which are added together with the aid of adders 53-2, 53-4 for producing the second sum $S_2$ which renders it possible to calculate $\hat{x}_\rho(m)$ in accordance with formula (19) i.e.:

$$S_2 = \sum_{r=0}^{\lambda-1} \hat{h}_\rho(r) \sin\left((2r - \lambda)\frac{\pi}{4}\right) \cdot Y_{\frac{N}{2}+\rho}(m - r)$$

An adder 54 forms the sum $S_1+S_2$ which constitutes the signal $\hat{x}_\rho(m)$ appearing at the output branch 18-$\rho$ of the synthesizing polyphase network.

On the other hand the samples $$Y_{\frac{N}{2}-1-\rho}(m - 5), Y_{\frac{N}{2}-1-\rho}(m - 3), Y_{\frac{N}{2}-1-\rho}(m - 1)$$

appearing at the points $b_5$, $b_3$, $b_1$ of the delay line connected to input 50 may also be represented by $$Y_{\frac{N}{2}-1-\rho}(m - \lambda + r + 1), \text{ i.e. by } Y_{\frac{N}{2}-1-\rho}(m - 5 + r) \text{ for } r = 0, 2, 4.$$

Similarly the samples $$Y_{\frac{N}{2}+\rho}(m - 4), Y_{\frac{N}{2}+\rho}(m - 2), Y_{\frac{N}{2}+\rho}(m)$$

appearing at the points $b_4$, $b_2$, $b_0$ of the delay line connected to input 51 may also be represented by $$Y_{\frac{N}{2}+\rho}(m - 5 + r) \text{ for } r = 1, 3, 5.$$

The points $b_5$, $b_3$, $b_1$ are connected to an input of multipliers 55-5, 55-3, 55-1 whose other input receives the coefficients $-\hat{h}_\rho(0)$, $\hat{h}_\rho(2)$, $-\hat{h}_\rho(4)$. The products produced by the multipliers are added together with the aid of adders 56-3, 56-5 for producing the signal $S'1$. It can be easily verified that $S'1$ is the first sum rendering it possible to calculate $\hat{x}_{N-1-\rho}(m)$ in accordance with formula (22), i.e.:

$$S'1 = \sum_{r=0}^{\lambda-1} \hat{h}_\rho(r) \cdot \cos\left((\lambda - 2r - 2)\frac{\pi}{4}\right) \cdot Y_{\frac{N}{2}-1-\rho}(m - \lambda + r + 1)$$

On the other hand the points $b_4$, $b_2$, $b_0$ are connected to an input of multipliers 55-4, 55-2, 55-0, whose other input receives the coefficients $-\hat{h}_\rho(1)$, $\hat{h}_\rho(3)$, $-\hat{h}_\rho(5)$. The product produced by these multipliers are added together with the aid of adders 56-2, 56-4 for producing the signal $S'2$. It can be easily verified that $S'2$ is the second sum rendering it possible to calculate $\hat{x}_{N-1-\rho}(m)$ in accordance with formula (22), i.e.:

$$S'2 = \sum_{r=0}^{\lambda-1} \hat{h}_\rho(r) \cdot \sin\left((\lambda - 2r - 2)\frac{\pi}{4}\right) \cdot$$

$$Y_{\frac{N}{2}+\rho}(m - \lambda + r + 1)$$

A subtractor 57 produces the difference $S'1-S'2$ which constitutes the signal $\hat{x}_{N-1-\rho}(m)$ appearing at the output branch $18_{N-1-\rho}$ of the synthesizing polyphase network.

The calculations of $\hat{x}_\rho(m)$ and $\hat{x}_{N-1-\rho}(m)$ are realized in the synthesizing polyphase network for $N/2$ values of $\rho$ going from 0 to $N/2-1$ (thus 6 values of $\rho$ going from 0 to 5), which renders it possible to obtain at the $N=12$ output branches of the polyphase network 18-0 to 18-11 the down-sampled signals $\hat{x}_0(m)$ to $\hat{x}_{11}(m)$ which are time-distributed with the aid of the commutator circuit 19 for producing the output signal $\hat{x}(n)$ of the synthesizing bank.

With the overall signal analysing and synthesizing bank system, each provided with a polyphase network and an arrangement for calculating the discrete cosine transform, the number of multiplications per second decreases to $$\left(\frac{N_c}{N} + N\right)f_e,$$

that is to say to 140,000 for $N=12$ and $N_c=66$ and the number of additions per second decreases to $$\left(\frac{N_c}{N} + N - 2\right)f_e$$

that is to say to 124,000.

What is claimed is:

1. A digital signal processing system comprising:
  a. an analysing filter bank for dividing an incoming signal, sampled at a rate $f_3$ and occupying a frequency band limited to $f_e/2$, into N contiguous subband signals having respective bandwidths of $f_e/2N$ and which are sampled at a rate $f_e/N$, said analyzing filter bank comprising N prototype lowpass filters, one for each subband and arranged in parallel along N respective branches, each prototype filter:
    i. having a same finite and symmetrical impulse response;
    ii. having a beginning-of-attenuation-band frequency $f_a$ less than $f_e/2N$; and
    iii. satisfying the condition $H^2(f)+H^2(f_e/2N-f)=1$ in a band of frequencies f extending from 0 to $f_a$, where H(f) is the absolute value of the frequency response to each prototype filter; and
    iv. comprising a modulation input for receiving a modulation signal, each modulation signal having:
      A. a frequency $f_k=(2k+1)f_e/(4N)$, where k is an integer, running from 0 $N-1$, representing a respective one of the N subbands;
      B. a phase $\alpha_k$, such that $\alpha_0$ is equal to one of $\pi/4$, $3\pi/4$, $5\pi/4$, and $7\pi/4$, and such that for two contiguous subbands represented by k and $k-1$, the difference $\alpha_k-\alpha_{k-1}$ is equal to one of $\pi/2$ and $-\pi/2$; and
      C. a time delay $\tau=(N_c-1)/(2f_e)$, where $N_c$ is a number of coefficients required for realizing the prototype filter; and
  b. a synthesizing filter bank for recoverying said incoming signal from said subband signals, said synthesizing filter bank comprising N prototype lowpass filters which are the same as the prototype filters used in the analyzing filter bank, except that the phase of the modulation signals is $-\alpha_k$,
whereby the number N is any integer greater than or equal to 2 and whereby $N_c$ is not constrained to be a multiple of N.

2. A digital signal processing system comprising an analysing filter bank for dividing an incoming signal, sampled at a rate $f_e$ and occupying a frequency band limmited to $f_e/2$, into N contiguous subband signals $X_k(m)$ having respective bandwidths of $f_e/2N$ and each being sampled at a rate of $f_e/N$, the analyzing filter bank comprising a polyphase network which comprises:
  a. means for distributing N samples of the incoming signal over N branches in each period NT, with $T=1/f_e$;
  b. first means for calculating N signals $P_\rho(m)$ from $\lambda$ consecutive signals entering the $\rho$th branch and from a set of coefficients, said first calculating means having N inputs for receiving the samples from the distributing means, where $\rho$ is an integer varying from 0 to $N-1$, $\lambda$ is the integer part of $(N-N_c+1)/N$, and $N_c$ is the number of coefficients in the set;
  c. N second means for calculating a double-odd discrete cosine transform, each second calculating means having N inputs for receiving the signals $P_\rho(m)$ and having an output at which a subband signal $X_k(m)$ is supplied, said subband signal being formed according to the following formulae:
    i. for $\lambda$ odd and for $\lambda$ even and N even:

$$X_k(m) = \sum_{\rho=0}^{N-1} C_N(k,\rho) \cdot P_\rho(m)$$

where $$C_N(k,\rho) = 2\cos\left[\frac{(2k+1)(2\rho+1)}{4N}\pi\right]$$

ii. for $\lambda$ even and N odd:

$$X_k(m) = \sum_{\rho=0}^{N-1} C'_N(k,\rho) \cdot P_\rho(m)$$

where $$C'_n(k,\rho) = 2\cos\left[\frac{2(k+1)\rho}{2N}\pi\right]$$

whereby the analyzing filter bank filters an incoming signal according to a frequency response which is given by a succession of N elementary frequency responses, each of the N frequency responses having a shape which corresponds to a frequency response to a same prototype filter, which prototype filter is defined by the $N_c$ coefficients and supplied with a modulation input for receiving a plurality of signals having respective frequencies and whereby N is any integer greater than or equal to two and whereby $N_c$ is not constrained to be a multiple of N.

3. A system as claimed in claim 2, characterized in that first calculating means calculates each signal $P_\rho(m)$ in accordance with the following formulae:

(a) for λ even and N even:

$$P_\rho(m) = P^{(2)}_{\frac{N}{2}-1-\rho}(m) + P^{(2)}_{\frac{N}{2}+\rho}(m) \text{ for } 0 \leq \rho \leq \frac{N}{2} - 1$$

$$P_\rho(m) = P^{(1)}_{\rho-\frac{N}{2}}(m) - P^{(1)}_{\frac{3N}{2}-\rho-1}(m) \text{ for } \frac{N}{2} \leq \rho \leq N - 1$$

where $$P^{(1)}_\rho(m) = \sum_{r=0}^{\lambda-1} \hat{h}_\rho(r)\cos\left((2r - \lambda)\frac{\pi}{4}\right) \cdot x_\rho(m - r)$$

$$P^{(2)}_\rho(m) = \sum_{r=0}^{\lambda-1} \hat{h}_\rho(r)\sin\left((2r - \lambda)\frac{\pi}{4}\right) \cdot x_\rho(m - r)$$

(b) for λ even and N odd:

$$P_o(m) = P^{(2)}_{\frac{N-1}{2}}(m)$$

$$P_\rho(m) = -\left[P^{(2)}_{\frac{N-1}{2}-\rho}(m) + P^{(2)}_{\frac{N-1}{2}+\rho}(m)\right] \text{ for }$$

$$1 \leq \rho \leq \frac{N-1}{2}$$

$$P_\rho(m) = P^{(1)}_{\rho-\frac{N+1}{2}}(m) - P^{(1)}_{\frac{3N-1}{2}-\rho}(m) \text{ for }$$

$$\frac{N+1}{2} \leq \rho \leq N - 1$$

(c) for λ odd:

$$P_\rho(m) = \sum_{r=0}^{\lambda-1} \hat{h}_\rho(r)\left[\cos\left((2r - \lambda + 1)\frac{\pi}{4}\right)x_\rho(m - r) + \sin\left((2r - \lambda + 1)\frac{\pi}{4}\right)x_{N-1-\rho}(m - \lambda + r + 1)\right]$$

$\hat{h}_\rho(r)$ representing λ coefficients h(n) of the prototype filter for $n=rN+\rho$, $\hat{x}_\rho(m-r)$ representing λ samples entered into a branch ρ of the polyphase network up to said period NT characterized by m.

4. The system of claim 2 or 3 comprising a synthesizing filter bank for recovering said incoming signal from said subband signals, the synthesizing bank comprising:

(a) N third means for calculating a double-odd discrete cosine transform, having N inputs for receiving the N subband signals $X_k(m)$ and having N outputs at which N signals $Y_\rho(m)$ are provided according to the following formulae:
for λ odd and for λ even and N even:

$$Y_\rho(m) = \sum_{k=0}^{N-1} C_N(k,\rho) \cdot X_k(m)$$

for λ even and N odd:

-continued
$$Y_\rho(m) = \sum_{k=0}^{N-1} C_N(k,\rho) \cdot X_k(m)$$

(b) a polyphase network having N inputs for receiving the signals $Y_\rho(m)$ and comprising fourth means for calculating, at each period NT, indicated by m, and for each branch, indicated by ρ, a signal $\hat{x}_\rho(m)$, from the coefficients of the prototype filter and from λ consecutive samples of $Y_\rho(m)$;

(c) means for time distributing the N samples of $x_\rho(m)$ to produce a recovered input signal.

5. A system as claimed in claim 4, wherein the fourth calculating means calculates the signal $\hat{x}_\rho(m)$, in accordance with the following formulae:

(a) for λ even and N even:

$$\hat{x}_\rho(m) = \sum_{r=0}^{\lambda-1} \hat{h}_\rho(r)\left[\cos\left((2r - \lambda)\frac{\pi}{4}\right) \cdot Y_{\frac{N}{2}-1-\rho}(m - r) + \sin\left((2r - \lambda)\frac{\pi}{4}\right) \cdot Y_{\frac{N}{2}+\rho}(m - r)\right]$$

$$\hat{x}^{(m)}_{N-1-\rho} = \sum_{r=0}^{\lambda-1} \hat{h}_\rho(r)\left[\cos\left((2r - \lambda - 2)\frac{\pi}{4}\right) \cdot Y_{\frac{N}{2}-1-\rho}(m - \lambda - r + 1) - \sin\left((2r - \lambda - 2)\frac{\pi}{4}\right) \cdot Y_{\frac{N}{2}+\rho}(m - \lambda + r + 1)\right]$$

for $0 \leq \rho \leq \frac{N}{2} - 1$ (b) for λ even and N odd:

$$\hat{x}_\rho(m) = \sum_{r=0}^{\lambda-1} \hat{h}_\rho(r)\left[\cos\left((2r - \lambda)\frac{\pi}{4}\right)Y_{\frac{N-1}{2}-\rho}(m - r) + \sin\left((2r - \lambda)\frac{\pi}{4}\right)Y_{\rho+\frac{N+1}{2}}(m - r)\right]$$

for $0 \leq \rho \leq \frac{N-1}{2}$ $$\hat{x}_\rho(m) = \sum_{r=0}^{\lambda-1} \hat{h}_\rho(r)\left[\cos\left((2r - \lambda)\frac{\pi}{4}\right)Y_{\rho-\frac{N-1}{2}}(m - r) - \sin\left((2r - \lambda)\frac{\pi}{4}\right)Y_{\frac{3N-1}{2}}(m - r)\right]$$

for $\frac{N+1}{2} \leq \rho \leq N - 1$ where $Y_N(m) = 0$ whatever the value of N.

(c) for λ odd:

$$\hat{x}_\rho(m) = \sum_{r=0}^{\lambda-1} \hat{h}_\rho(r)\left[\cos\left((2r - \lambda - 1)\frac{\pi}{4}\right)Y_\rho(m - r) - \sin\left((2r - \lambda - 1)\frac{\pi}{4}\right)Y_{N-1-\rho}(m - r)\right]$$

for $0 \leq \rho \leq N - 1$.

* * * * *